United States Patent [19]

Braden

[11] Patent Number: 5,673,799
[45] Date of Patent: Oct. 7, 1997

[54] MACHINE FOR TESTING AND SORTING CAPACITOR CHIPS AND METHOD OF OPERATING SAME

[75] Inventor: Denver Braden, San Marcos, Calif.

[73] Assignee: Chip Star Inc., San Marcos, Calif.

[21] Appl. No.: 464,310

[22] Filed: Jun. 5, 1995

[51] Int. Cl.⁶ .......................... B07C 5/344; G01R 31/02
[52] U.S. Cl. .......................... 209/574; 209/919; 324/537; 324/757
[58] Field of Search ........................ 209/571, 572, 209/573, 574, 644, 919; 324/537, 754, 757, 758

[56] References Cited

U.S. PATENT DOCUMENTS

| | | | |
|---|---|---|---|
| 3,750,878 | 8/1973 | Atchley et al. | 209/573 X |
| 3,980,553 | 9/1976 | Quinn | 209/573 X |
| 4,406,373 | 9/1983 | Braden | 209/574 |
| 4,790,438 | 12/1988 | Wilhelm et al. | 324/537 X |

FOREIGN PATENT DOCUMENTS

| | | | |
|---|---|---|---|
| 6167539 | 6/1994 | Japan | 324/537 |
| 1613208 | 12/1990 | U.S.S.R. | 209/573 |

*Primary Examiner*—William E. Terrell
*Assistant Examiner*—Tuan Nguyen
*Attorney, Agent, or Firm*—John J. Murphey, Esq.; Murphey Law Offices

[57] ABSTRACT

A method of continuously testing and sorting large quantities of capacitor chips, including the steps of loading the chips into identical rows of aligned positions in a rotatable member, simultaneously and sequentially rotating the member to advance the chips past a plurality of testing stations and past subsequent sorting stations, each station successively aligned momentarily with each row of the aligned chips, simultaneously and sequentially conducting a plurality of sequential electrical testing to the chips as they are rotated from test station to test station and classifying them in a plurality of ranges of values at the last test station, and at each subsequent sorting station, sequentially collecting chips belonging in one of the ranges of values until all the chips are collected before the rotating member returns for reloading.

1 Claim, 2 Drawing Sheets

MACHINE FOR TESTING AND SORTING CAPACITOR CHIPS AND METHOD OF OPERATING SAME

BACKGROUND OF THE INVENTION

1. Field of the Invention

This invention pertains to the field of miniature capacitor chips more particularly, this invention pertains to a machine for subjecting the chips to a plurality of tests and sorting them according to values assigned to them from the tests.

2. Description of the Prior Art

Computers and other electronic appliances are growing in importance in our daily lives at a rate that appears to be reaching exponential proportions. These electronic devices reach all ages and areas of endeavor. Infants are exposed to computers through electronically-based games that teach musical tones and image recognition, such as cows, trucks, bananas, etc. Preschoolers play games on computers that lay the basis for later learning math, reading and geography. Elementary, Junior High, High School and College students take classes in computer theory, programming and operation. For those who entered the work force before computers became a part of the school curriculum, there are seminars, home-study courses and public television courses that introduce one to computers, computer operation and software operation. Virtually every business in the United States of America uses computers somewhere in its operation.

The use of computers to undertake business functions and educational activities has created a demand for more capacity and faster processing times. What started out as a simple Commodore® 64 computer with black/white monitor (having 64 k of memory utilizing a very short program) now is a 1–32 megabyte RAM/500 megabyte hard drive computer with color monitor, offering programs that include moving pictures and music. In addition, other electronic devices, such as VCRs, television sets, cameras, camcorders, auto alarms, radios and the like are using more and more computer hardware to become more user-friendly with expanded capabilities. Competition among various electronic companies has forced computer and computer-accessory manufacturers to design more powerful and more capable circuitry. Just one indication of the astonishing rate of computer development is seen in the case of hard drives. In the past 13 years, hard drive storage capacity has increased at an average annual rate of a factor of three. Where in 1982 a standard hard drive was 10 megabytes, it has grown to 500 megabytes in 1995 and is estimated to exceed one gigabyte within a year.

At the center of all this activity is a device so small that one could easily miss its existence, if not careful to look for it. It is a miniature capacitor, of a general size of 0.040 inches long with a square or rectangular cross-section 0.020 inches on a side, with spaced-apart flat end surfaces. These devices are constructed of multiple layers of electrically conductive material held apart by a ceramic dielectric matrix that is fired to produce a hard, minute device much smaller than a grain of rice. Used by the thousands in computer circuitry, these capacitors, called "chips" by those in the trade, are in great demand. In the circuitry, they are soldered directly to the computer circuit board on their flat side surface and often resemble miniature bumps on the circuit board.

For this special soldering technique, the conductive end surfaces of the chips are coated with a silver paste and fired, at high heat, to cure or set the silver paste to a coating that is easily soldered to a specially designed copper "flat" located on the circuit board. To prepare these chips, I have invented hand-operated tools with which to position the chips for coating with a curable compound, reference my U.S. Pat. Nos. 4,381,321; 4,393,808; 4,395,184; and 4,526,129. More recently, I have invented a machine that continually coats these chips, reference my U.S. Pat. No. 5,226,382. But, coating and curing these chips is only part of the process. Before using them in any circuitry, each chip must be tested to determine if it is of a capacitance value usable in the circuit and has sufficient electrical and physical properties that will allow it to withstand the rigors of electrical operation. Further, each chip must be sorted into groups of specific ranges of these electrical properties so that they can be used most effectively in the electronic circuitry.

Because of imperfections in materials and building processes, capacitors have parasitic qualities: impedance elements other than capacitance. Each parasitic detracts from the capacitor's ideal characteristic. Parasitics thus increase the difficulty of performing an accurate capacitance measurement.

The property of a capacitor that limits the flow of alternating current is called its reactance ($X_c$) and is measured in ohms. The term impedance (Z), also measured in ohms, includes the effect of ordinary ohmic resistance as well as reactance.

"Capacitance" is simply the ratio of the charge acquired (Q) to the applied voltage (V) for any given pair of conductors that are near one another. More specifically:

$$\text{Capacitance} = \frac{\text{charge on either plate}}{\text{potential difference}}$$

$$C = \frac{Q}{V}$$

$$\text{farads} = \frac{\text{coulombs}}{\text{volts}}$$

A capacitor has a capacitance of one farad if one coulomb of charge causes a potential difference of one volt. For most applications, the microfarad (1 µF=$10^{-6}$ F) or the picofarad (1 pF=$10^{-12}$ F) is used. A capacitance (or CAP) test is conducted to measure the capacitance of the chip.

An ideal pure reactance dissipates no power; all energy used to charge it is recovered upon discharge. In the real world, however, there is always some associated resistance that does dissipate power, decreasing the amount of energy that can be recovered. The quality factor (Q) is used to describe a capacitors' purity. Q is $2\pi$ times the ratio of energy stored to energy lost (over unit time), and is a unitless number. A Dissipation Factor (or Df) test is used to determine this property of the capacitor.

A "Flash" test is conducted for detecting internal flaws which are detrimental to the electrical integrity of the capacitor and cannot be found with normal capacitance and dissipation factor measurements. The most common flaws take the form of irregular voids, cracks or open areas, embedded foreign material, thin spots in the dielectric or electrode, bad contact between the electrode and the termination, etc. Typically, the part is subjected to a test voltage of more than twice its rated voltage and held at that voltage for a short period of time.

The sequence of the "Flash" test is:

a. Part Present Test—verifies the capacitor is present and made good contact with the test probes.

b. Charge—the capacitor is charged with a constant current to the proper stress voltage.

c. Soak—the capacitor is held at this voltage for a short period of time.

d. Test—leakage current through the capacitor is compared against a limit.

e. Discharge—the capacitor is discharged at some constant current rate.

f. Part Present Test—insures the capacitor didn't open during previous testing.

g. Check Test—because the capacitor may fail under the stress of the discharge as well as the charge, a check test is performed. This test is a repeat of the previous test, only with a reduced voltage (usually the rated voltage).

The insulation resistance (or IR) is a measure of leakage current across the capacitor and it is usually expressed as the product of the resistance and the capacitance, or in microamperes. For example, a 1 µF capacitor tested at 25 vdc with 1000 MΩ resistance, has an IR of 1000 #-µF, or a leakage current of 0.025 µA. The sequence of this test is usually to charge the part over a long period of time to insure a maximum charge, then after removing the charging, monitor the discharging over a short period of time and calculate the internal resistance by the rate of decay.

All these tests are usually performed as follows:

a. Station 1—Both CAP and Df
b. Station 2—Flash
c. Station 3—IR
d. Station 4—Both CAP and Df (redundant)

Also, since the soak time for the true IR test can be several seconds, there is more than one station for the IR test, sometimes up to 10 charging stations and a single test station. This way, the bowl can keep indexing for the faster tests, while still charging the parts for the IR test.

Each of these tests requires physical contact with the ends of the chips. In some tests, the contact is single and only momentary. In other tests, the contact is multiple and/or prolonged. Prior to these required tests, I invented a machine to conduct tests upon those chips and sort them pursuant to their test results, reference my U.S. Pat. No. 4,406,373. This patented machine relies on the process of placing the chips in a planar carrier and arranging the holes in straight files and straight rows. The carrier is first laid flat and loose chips cast over it, and the bank subjected to vibration to urge the chips into the holes. The chip-filled carrier is then raised up and placed on a trolley at an oblique angle and indexed past a plurality of test probes. The chips rest against or abut a conductive layer and the probes are advanced into contact with only one end of the chip, the other end being treated in common with other chips through the conductive layer. Once the row of chips has been tested, the carrier passes into contact with a set of receptacles where the values assigned to a particular chip during testing finds a corresponding receptacle having a range of values into which the chip's value fits, whereupon it is blown by compressed air out of its hole into that receptacle. The problem with this machine is that it is a batch process and does not have the capacity to test and sort the large quantities of capacitor chips needed in today's markets. In addition, the tests that can be conducted with this machine are limited and cannot involve all of the tests now needed on modern chips. The patented machine has been modified to run by robotics, however, it remains a batch process with limited testing, high labor costs and low output. In this patented machine with its robotic improvements, significant time is lost in loading the planar carrier with chips and transferring them to the machine to begin the testing operation, as well as removing the empty carrier and relocating it to a remote area for reloading with fresh chips. This lost time has become an important factor of late where higher and higher throughput rates are demanded in the industry. Along with these problems is the fact that my previously patented machine cannot perform the plurality of tests in one operation that are currently called for by the industry. This significant handling and inability to perform a plurality of tests adds to the labor and overall manufacturing costs of chips as well as reduces their production rate.

SUMMARY OF THE INVENTION

I have now invented a new machine that is the subject of this patent application, for the continuous testing and sorting of miniature computer chips. In addition to being continuous in operation, it can perform all the tests heretofore described in the format and sequence which is required under present standards. The machine is smaller than my previous batch machine and has fewer moving parts. It is self-loading and the testing and sorting is done continuously without the need for extensive man power. The additional tests provided by this new machine means that subsequent testing is eliminated, handling time is reduced and the chips are less likely to be contaminated or subject to damage before being soldered to the circuit board. This saving in subsequent testing reduces manufacturing and processing costs and results in a better product at lower costs.

My invention centers around a dished or shallow bowl having a slanted wall portion in which is formed a plurality of holes preferably arranged in rows and concentric circles, into which the miniature capacitor chips are loaded by vibration. The bowl is driven to rotate in an indexing manner to carry the holes containing chips from the loading area past a series of testing stations where they are momentarily paused while probes advance into contact with the end coating of the chips. During this pause, the capacitance (CAP) test, dissipation (Df) test, flash test, insulation (IR) test and final capacitance test are thereafter conducted in sequence. A controller controls the conduct of the tests and assigns certain values to the chips to aid in determining their ability to be utilized on circuit boards. As the chips are indexed away from the testing stations, they encounter a plurality of successively aligned sorting stations, each leading to a receptacle for receipt of chips whose assigned values fall within the range of values assigned to that receptacle. Upon momentary pausing over a particular sorting station, compressed air or other means is employed to move the chip from its position in the bowl into the receptacle for capture.

Accordingly, the main object of this invention is a machine that can test and sort miniature capacitor chips on a continuing basis. Other objects of the invention include a machine that performs a plurality of tests in ordered sequence on the chips, one at a time, and that thereafter sorts and collects them according to values placed upon them or assigned to them during the tests; a machine that continuously loads, tests, and sorts the miniature chips without interruption; a machine that contacts the miniature chips using probes that come into contact with both conducting surfaces of the chip so that each one is provided with an exclusive circuit to the testing station as opposed to having all the chips grounded to a common conductive plate; a machine that requires less operator attention than those currently employed; a machine that has a higher handling rate and throughput than any now in existence; and, a machine that utilizes less space and fewer parts than other machines performing the same or similar functions.

These and other objects of the invention may be determined by reading the description of the preferred embodiments along with the drawings attached hereto. The scope of protection sought by the inventor may be gleaned from a fair reading of the claims that conclude this specification.

DESCRIPTION OF THE PREFERRED EMBODIMENT

Figure 1:
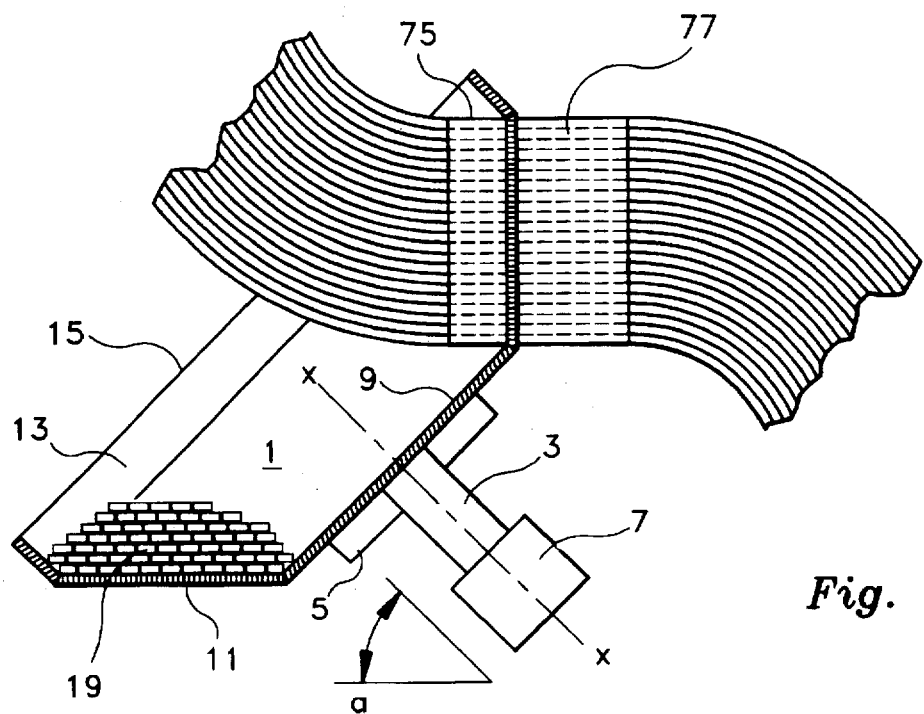
FIG. 1 is a side view, partially in section, showing the basic dished or shallow bowl of my invention with some associated accessories.
Figure 2:
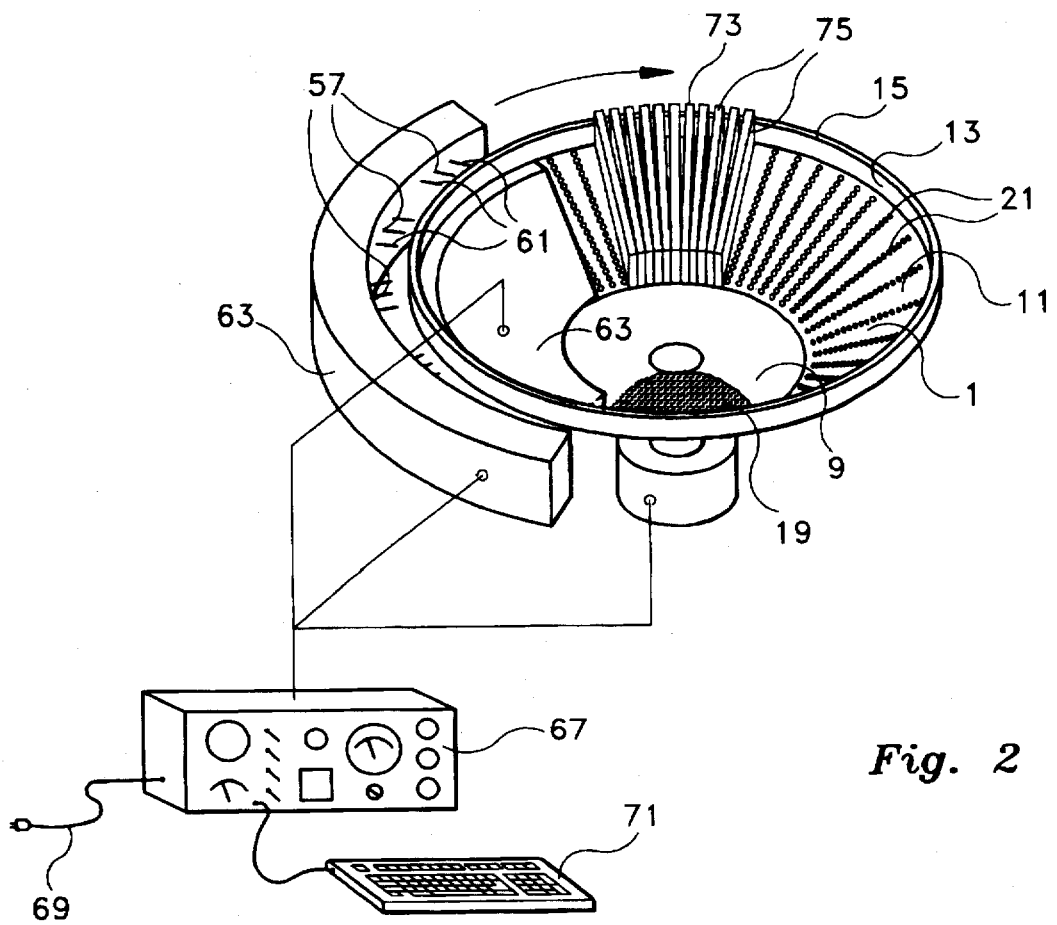
FIG. 2 is a front view of the embodiment shown in FIG. 1 together with other accessories.

Turning now to the drawings, where like elements are identified with like numerals throughout the seven figures, FIGS. 1 and 2 show the basic idea of the invention and show a shallow or dished bowl 1 that is mounted on a center shaft 3 and a bearing 5 and turned by a motor 7 in rotary motion in direction of the arrow shown in FIG. 2. Preferably, bowl 1 is made of plastic, fiber-reinforced resin, or some other strong, dielectric material and is shaped such as to have a lower center section 9, an intermediate, inwardly-slanted, wall portion 11, outboard thereof, and an upstanding outer portion 13 terminating in an elevated rim or upper distal edge 15 concentric with slanted wall portion 11.

Shaft 3 and bearing 5 are mounted at a positive angle "a" to the horizontal so that bowl 1 is tilted. It is preferred that angle "a" is adjusted such that slanted wall portion 1 passes through the horizontal at the lowest portion of its rotational travel about central shaft axis x—x as shown in FIG. 1. In this manner, a small inventory of miniature computer chips 19 will remain located at the lowest part of bowl 1 on slanted wall portion 11 and maintained therein by upwardly sloping center section 9 at the rear thereof and by upstanding outer portion 13 at the front thereof. The chips will tumble over themselves and remain in that area while bowl 1 is rotated.

Figure 3:
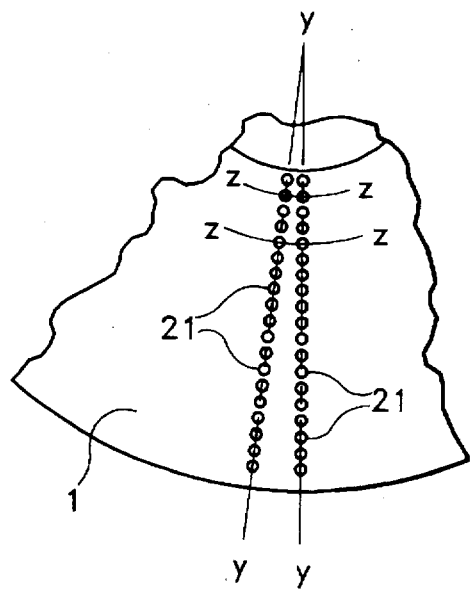
FIG. 3 is an illustrative view of the arrangement of holes in the bowl that are to receive miniature capacitor chips therein for testing and sorting.

A series of holes 21 are formed in slanted wall portion 11 of bowl 1, preferably axially normal to slanted wall portion 11 and preferably aligned in straight or radially aligned rows y—y and in circles z—z concentric to rim 15 as shown in FIG. 3. Rows y—y and circles z—z are equally arranged about slanted wall surface 11 so that when any specific row is located over a spot, the holes therein align over consistent points of location. As can be seen in FIG. 1, the tilt given bowl 1, combined with the slant of slanted wall 11, retains holes 21 at a positive angle with the horizontal throughout the entire rotation of said bowl. A positive angle with the horizontal means that gravity will not pull the chips out of their respective holes throughout any portion of the rotation of bowl 1.

Figure 4:
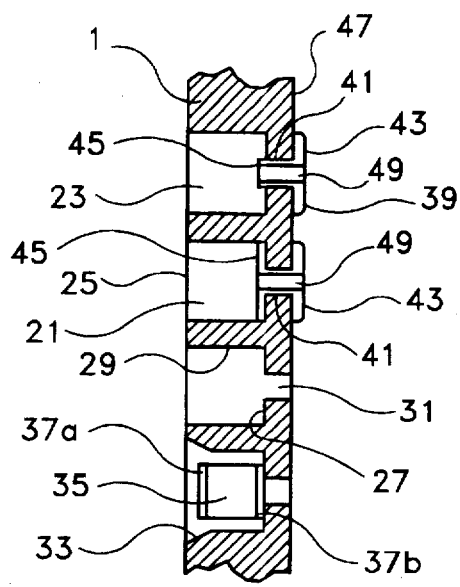
FIG. 4 is a sectional view of a portion of the bowl showing different embodiments of the hole and fittings used in the hole to facilitate testing of the computer chips.
Figure 6:
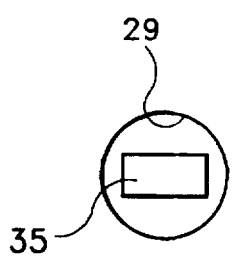
FIG. 6 is a top view of a capacitor chip receive in a hole in the bowl.

As shown in FIG. 4, the preferable form of holes 21 is a large open cylindrical chamber 23 having an open top 25, a flat base 27 and cylindrical side walls 29 therebetween. A central opening 31 is formed in base 27 through which a probe will eventually pass, and subsequently air will pass, as will be later explained. An outwardly beveled top 33 may be formed in the upper part of cylindrical side walls 29 to aid chips 35 from passing from inventory 19 into chamber 23. The size of chamber 23 is shown in FIG. 6 to be sufficiently large enough to allow chips 35 to enter in an upright position, with one conductive surface 37a located at the top thereof and the other surface 37b at the bottom thereof, adjacent central opening 31 but not in a sideways position with conductive surfaces 37a and 37b adjacent cylindrical side walls 29.

Figure 7:
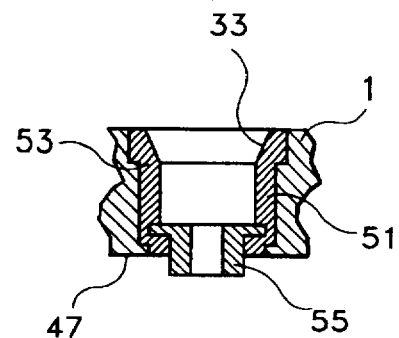
FIG. 7 is an illustrative view of a dielectric fitting for press-fitting or molding into the bowl to facilitate handling of the chips.

A small, hard fitting 39, such as that shown in FIG. 4, may be placed in chamber 23, adjacent base 27, for a chip to abut when in position in hole 21. Two such fittings 39 are shown in FIG. 4 to each comprise a body 41, extending between a top 43 and a bottom 45, where top 43 resides on the underside of bowl 1 adjacent the under surface 47 thereof and bottom 45 resides inside chamber 23, above base 27. A central passageway 49 passes completely through body 41 from (upside down) top to bottom. Fitting 39 can be made of metal or ceramic and be pressed, glued or molded into position. As shown in FIG. 7, a two-part fitting 51 can be used where a first part 53 forms the interior walls of chamber 23 and a second part 55 forms the base of said chamber and exits the bottom surface 47 of bowl 1.

Figure 5:
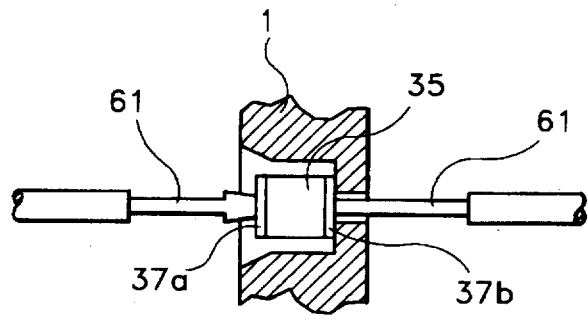
FIG. 5 is an illustrative view of how the probes at the testing stations enter into contact with the conductive surfaces of the capacitor chips.

As shown in FIG. 2, a series of electrical test stations 57 are arranged about bowl 1 in close proximity to slanted wall portion 11 and on both sides thereof, downstream from loose chip inventory 19. Each station 57 comprises a plurality of extendable electric probes 61 that extend from a housing 63 into contact with both conducting surfaces 37a and 37b of chips 35 when a chip-filled hole is positioned over a particular station 57 and bowl 1 subject to momentary pause thereover. As shown in FIG. 5, one probe 61 enters chamber 23 through top opening 25 to contact conducting surface 37a while the other probe 61 enters central opening 31 to contact conducting surface 37b. Care is taken to adjust the pressures of probes 61 against conducting surfaces 37a and 37b to ensure that chip 35 remains in position in chamber 23.

Probe 61 may be driven by compressed air, vacuum, hydraulic power or electricity from a station housing 63 under direction of electronic instructions issued by a controller 67 that is powered from a power line 69. Instructions are provided to controller 67 through a key board 71 or other such input device. The information inputted to controller 67 would set the parameters of the multi-function tests conducted on the chips and assign values to the chips depending upon the results of such tests. Controller 67 also ensures that motor 7, such as an electric stepper motor, rotates bowl 1 an exact angular distance in order to bring chip-filled holes 21 into alignment with the appropriate probe 61 so that the correct test can be applied to the chips. As previously described, some of the tests made on chips 35 take more than one application of energy or involve more than one set of collecting test results. These are accomplished by indexing the row of chips from one test station to the next where the subsequent test step is performed.

A series of sorting stations 73 containing a bank of receptacles 75 is positioned at the front of bowl 1 and arranged to be momentarily aligned with each row of chip-loaded holes 21 for the purpose of capturing chips 35 unloaded therefrom according to values placed or assigned to them during their pass through testing stations 57. The various receptacles are juxtaposed in radial orientation and preferably separated by dividers with transparent strips or covers in which to observe the number of chips captured. Located at the rear of bowl 1, opposite receptacle 75, is a bank 77 of compressed air nozzles. When a row of chip-filled holes is aligned over a particular receptacle, controller 67 controls the amount of air passing to the nozzles, through solenoid valves (not shown) to blow a particular chip 35 and dislodge it from its hole 21 and pass it into the aforesaid receptacle. This collecting process may also be performed using suction as opposed to compressed air.

The method of this invention comprises the steps of loading chips 35 into identical rows y—y in bowl 1, simultaneously and sequentially rotating bowl 1 to advance the loaded chips through a plurality of test stations 57 and past sorting stations 73, where, at each station, a chip-filled row of holes will momentarily pause in alignment therewith. At the electrical stations, a series of electrical tests are performed sequentially on the chips and they are classified into a plurality of ranges of values as they leave the last test station. At each subsequent sorting station, the chips are sequentially collected in groups belonging to ranges of values assigned to them whereupon bowl 1 is rotated to index the holes to the horizontal to be reloaded with new, untested chips.

In the sequential testing steps of the method, a chip that is shorted for any reason would fail the initial capacitance test and immediately be labeled a "reject". A chip passing the initial capacitance test would then be subject, in order, to a dissipation test, a flash test and an insulation resistance test. These tests are generally considered to be pass/fail tests. Any chip not passing one of these tests would also be labeled a "reject". Finally, the chips are given a redundant capacitance test and those that passed the preceding tests would be assigned values as to their capacitance. When these chips reach the sorting stations, one of the receptacles will be for the purpose of collecting all chips labeled "rejected" during the previously-performed tests. The other chips, i.e., those that are not rejected, would then be sorted as to their range of capacitance.

In practicing this method, the bowl is tilted so that the chips remain at a positive angle with respect to the axis of rotation x—x of the bowl shaft, as well as maintain a positive angle with the horizontal so that they do not drop out of the holes under force of gravity. When the bowl is fully loaded and all the tests are being conducted, the steps of loading, testing and sorting are done simultaneously and continuously. As the bowl rotates away from the last sorting station, all of its holes are empty and available for refilling as they pass under the inventory of loose chips at the bottom of the bowl's rotation.

While the invention has been described with reference to a particular embodiment thereof, those skilled in the art will be able to make various modifications to the described embodiment of the invention without departing from the true spirit and scope thereof. It is intended that all combinations of elements and steps which perform substantially the same function in substantially the way to achieve substantially the same result are within the scope of this invention.

What is claimed is:

1. A method of continuously testing and sorting large quantities of miniature capacitor chips having electrically conducting surfaces on opposite ends thereof, comprising the steps of:

a) loading the chips into identical rows of aligned positions in the slanted side wall of a dished bowl set at a tilt that retains the chips in position throughout the rotation thereof said bowl including arranging the chips in identical radially-directed rows and concentric circles and aligning said chips perpendicular to the slanted side wall of said bowl;

b) simultaneously stepping said bowl in a rotating manner to advance each row of chips sequentially past a plurality of electrical testing stations and momentarily pausing said rows over each station;

c) simultaneously subjecting one row of chips at a time to electrical testing sequentially at a plurality of testing stations arranged subsequent to the loading of the chips and applying a value to each chip as it leaves the last testing station; and, d) advancing the tested and valued chips to a plurality of sorting stations where each chip is momentarily aligned with a receptacle having a range of values including the value of a particular chip, then depositing said chip in that receptacle.

* * * * *